United States Patent [19]

Matsuoka et al.

[11] Patent Number: 5,167,515
[45] Date of Patent: Dec. 1, 1992

[54] SOCKET FOR ELECTRIC PART

[75] Inventors: Noriyuki Matsuoka, Yokohama; Kazumi Uratsuji, Tokyo, both of Japan

[73] Assignee: Yamaichi Electric Co., Ltd., Tokyo, Japan

[21] Appl. No.: 734,684

[22] Filed: Jul. 23, 1991

[30] Foreign Application Priority Data

Jul. 24, 1990 [JP] Japan .................................. 2-197017

[51] Int. Cl.⁵ .............................................. H01R 4/66
[52] U.S. Cl. .................................... 439/108; 439/337; 439/342
[58] Field of Search ............... 439/108, 181, 337, 342, 439/329, 331

[56] References Cited

U.S. PATENT DOCUMENTS

| | | | |
|---|---|---|---|
| 4,655,518 | 4/1987 | Johnson et al. | 439/108 X |
| 5,002,495 | 3/1991 | Tanaka | 439/108 |
| 5,002,499 | 3/1991 | Matsuoka | 439/342 |

Primary Examiner—Eugene F. Desmond
Attorney, Agent, or Firm—Wenderoth, Lind & Ponack

[57] ABSTRACT

A socket for an electric part has a socket body formed of an insulating material and a plurality of contacts arranged on the socket body and adapted to contact with terminals of an electric part. The socket part has a conductive pin implanted therein. The conductive pin has a current-collecting portion adapted to collect electric charge on a surface of the socket body, and a grounding portion directly connected to the current-collecting portion and projecting from the socket body.

3 Claims, 5 Drawing Sheets

SOCKET FOR ELECTRIC PART

BACKGROUND OF THE INVENTION

1. Field of the Invention

This invention relates to a socket for an electric part, which makes it possible, on the socket side, to effectively eliminate static electricity which frequently exerts adverse effects on to an electric part.

2. Statement of the Prior Art

As a measure for eliminating static electricity in the conventional socket for an electric part such as an IC, etc., a conductive resin is employed as a material for forming a socket body or means for irradiating ions on the socket body is provided.

However, a socket formed of a conductive resin has a problem that leakage of electric current occurs due to irregularity of insulation resistance values, while a socket provided with a ion irradiation means has a problem that large-scale equipment for irradiating ions is required.

SUMMARY OF THE INVENTION

It is therefore a general object of the present invention to provide, in order to obviate the above-mentioned problems, a socket for an electric part which is capable of effectively eliminating static electricity charged on the surface of the socket with simple and inexpensive means as will be described hereinafter.

As means for eliminating static electricity, according to the present invention, a conductive pin is implanted in a socket body, the conductive pin including a current-collecting portion disposed in such a manner as to collect the electric charge on the surface of the socket body, and a grounding portion directly connected to the current-collecting portion and projecting from the socket body.

The conductive pin is further provided with means for slide-fitting to a contacting and releasing movable plate of a contact in order to eliminate even the static electricity on the surface of the movable plate, or the conductive pin is provided with means for short-circuiting the conductive pin to conductive shafts pivotally supporting a lateral movement operating lever of the movable plate, or an electric part pressing cover and a lock lever, so that the conductive pin can cooperate with the shafts and the lever of the socket in order to enhance the effect of elimination of the static electricity.

According to the present invention, the electric charge on the surface of the socket body formed of an insulating material is collected by the current-collecting portion disposed in such a manner as to contact with the surface of the socket body, and such collected electric charge is rapidly released through the grounding portion connected to a circuit board, etc.

At that time, by slide-fitting the current-collecting portion of the conductive pin to the contacting and releasing movable plate, even the static electricity on the surface of the movable plate can satisfactorily be eliminated.

Furthermore, by providing means for short-circuiting the current-collecting portion of the conductive pin to the shafts pivotally supporting the lateral movement operating lever of the movable plate, the electric part pressing cover, etc., the effect of elimination of static electricity can remarkably be enhanced.

The present invention can be practiced at a low cost by such handy means as that the conductive pin having the above-mentioned elements is implanted into the socket body in such an arrangement as described above and is capable of effectively achieving the originally intended object.

The above object of and advantages obtained by the present invention will become apparent from the accompanying drawings and the detailed description of the invention to follow.

DETAILED DESCRIPTION OF THE EMBODIMENTS

Figure 1:
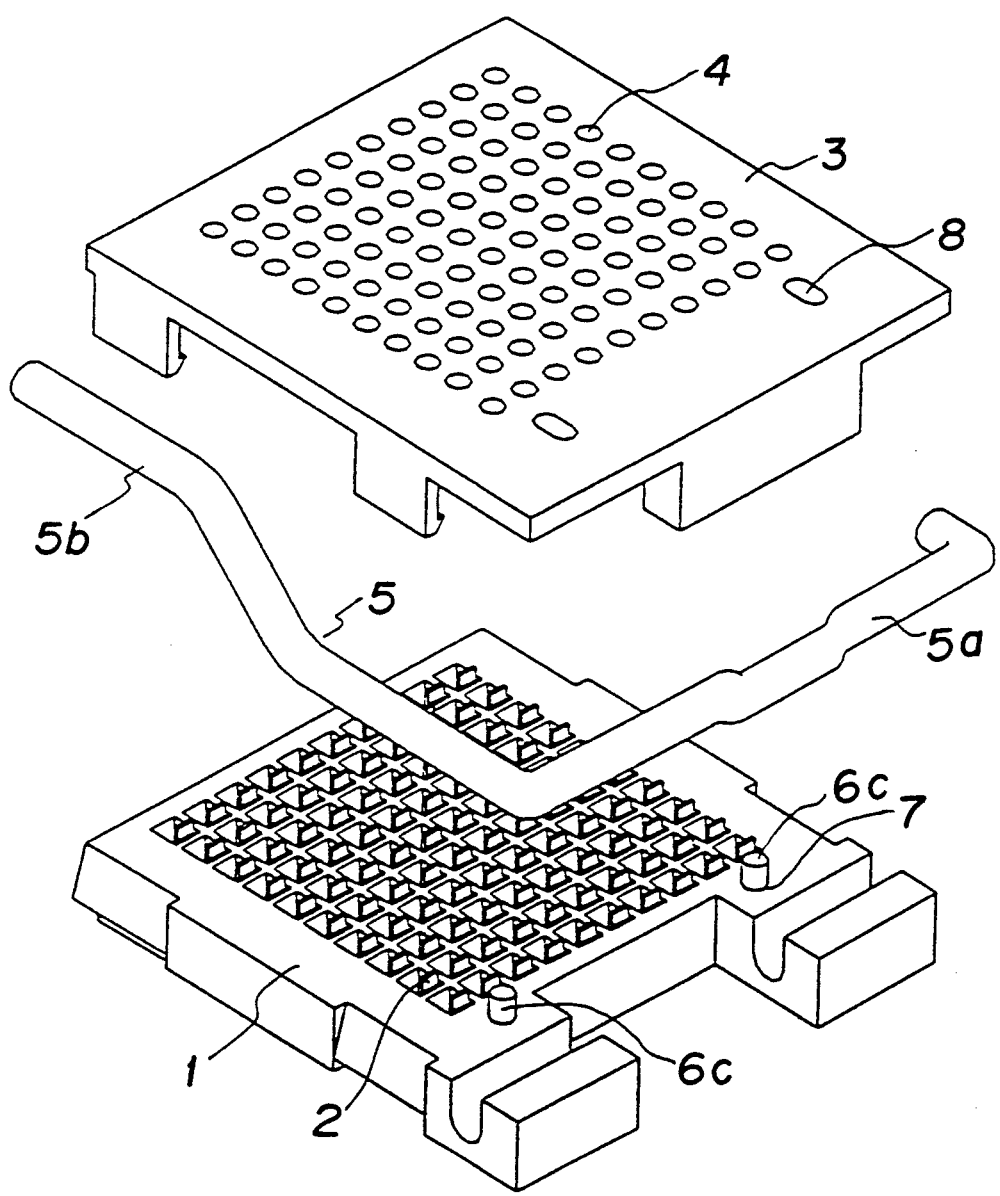
FIG. 1 is an exploded perspective view of a socket for an electric part according to the first embodiment of the present invention.
Figure 2:
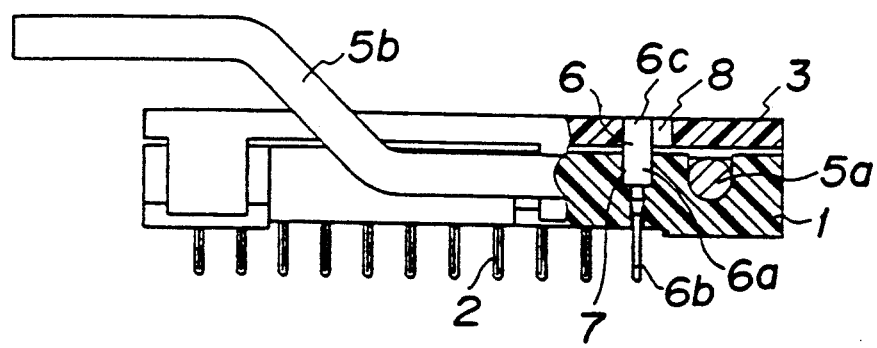
FIG. 2 is a side view, partly in section, of the socket for an electric part of FIG. 1.
Figure 3:
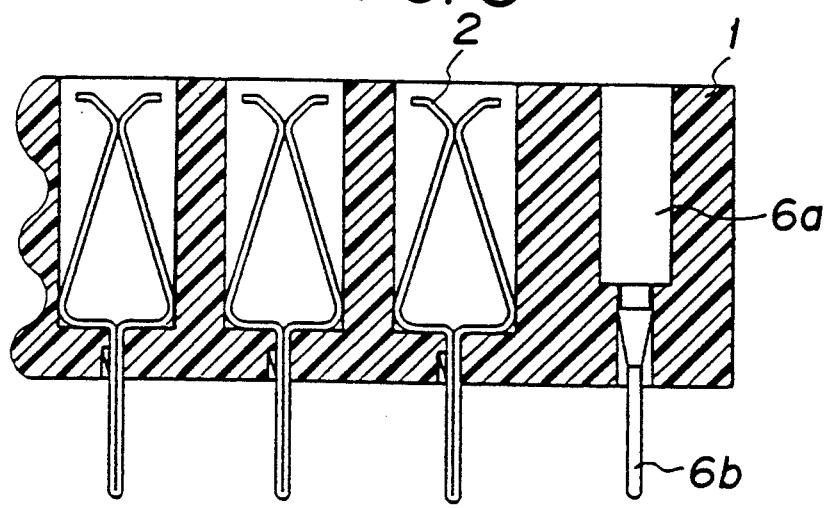
FIG. 3 is a sectional view of a socket for an electric part showing a second embodiment of the present invention.
Figure 4:
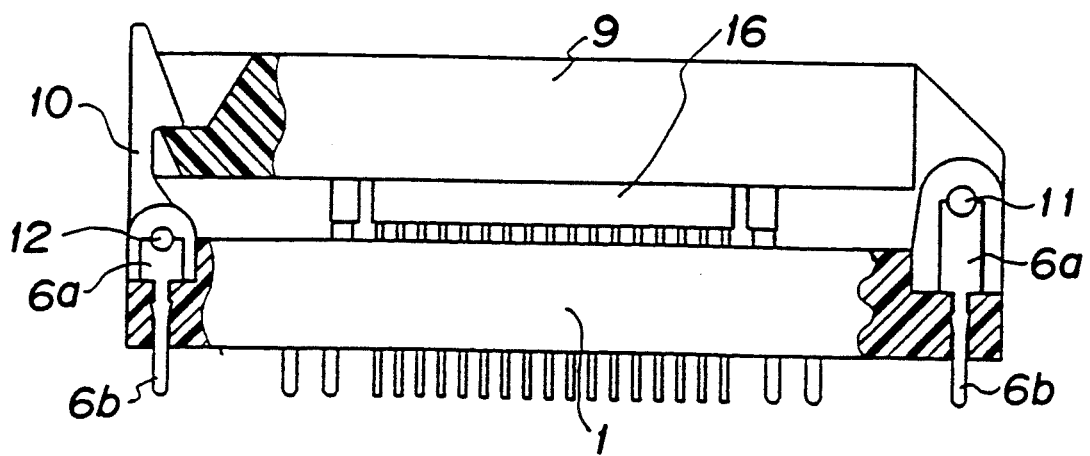
FIG. 4 is a side view, partly in section, of the socket for an electric part showing a third embodiment of the present invention.
Figure 5:
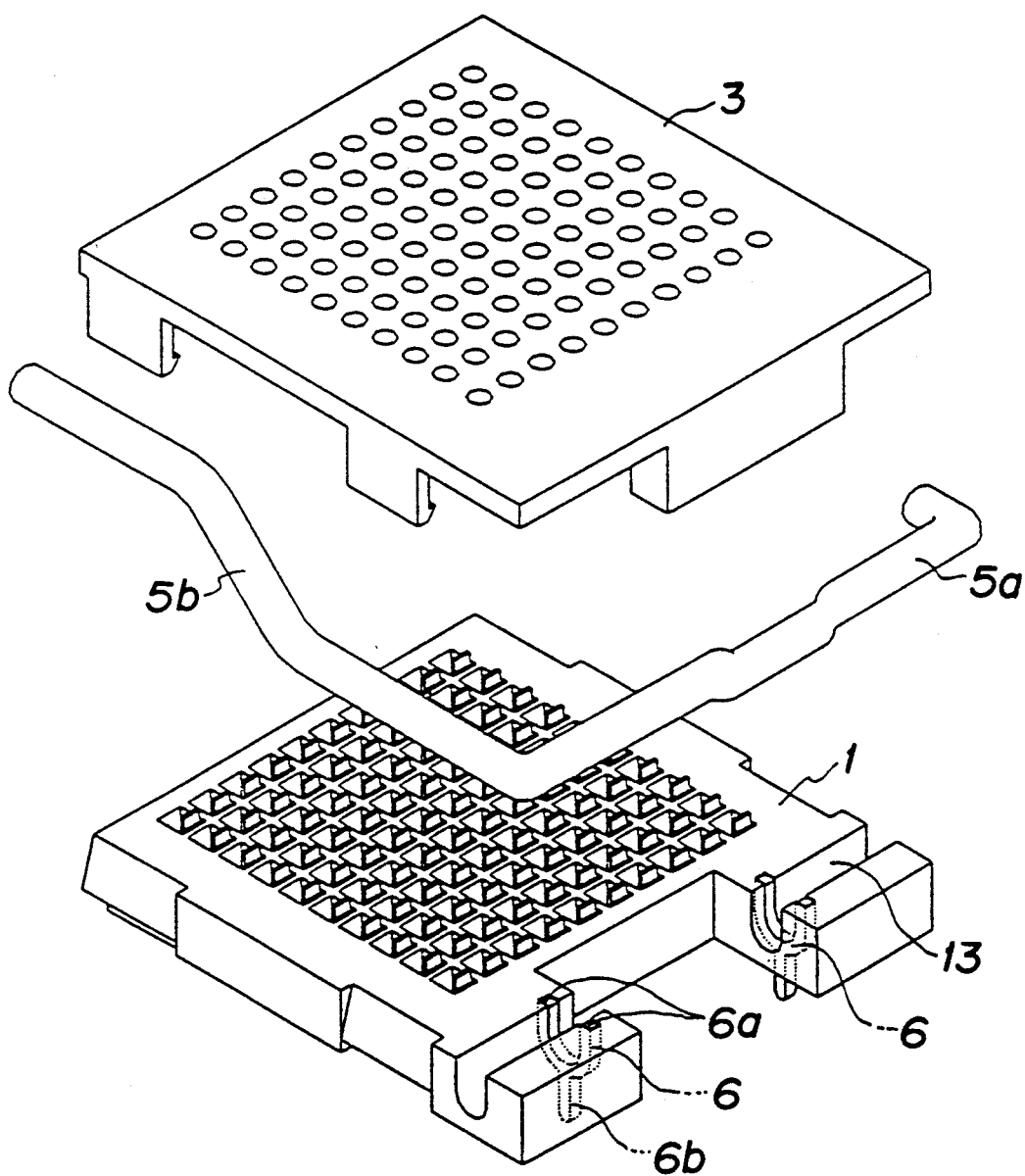
FIG. 5 is an exploded perspective view of a socket for an electric part showing a fourth embodiment of the present invention.
Figure 6:
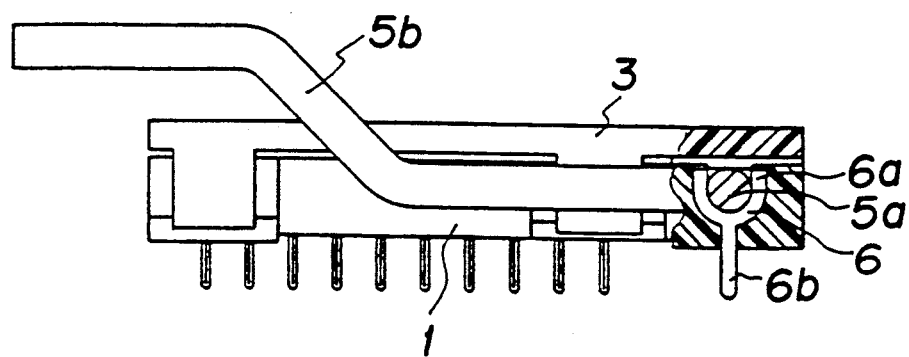
FIG. 6 is a side view, partly in section, of the socket for an electric part of FIG. 5.
Figure 7:
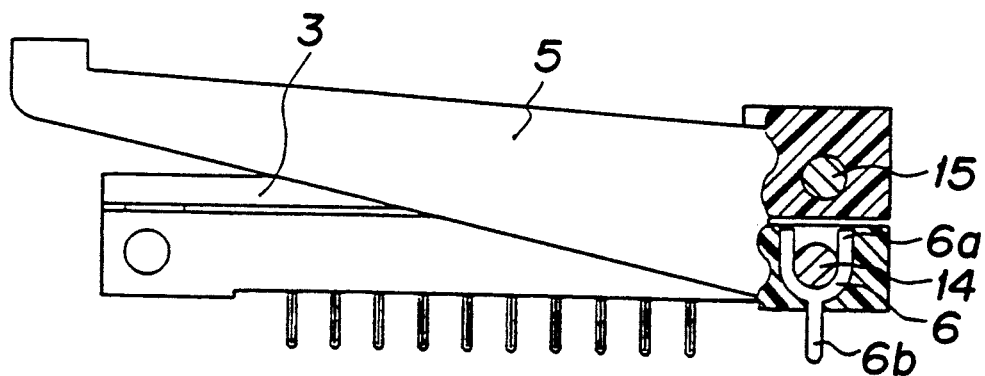
FIG. 7 is a side view, partly in section of a socket for an electric part showing a fifth embodiment of the present invention.

Several preferred embodiments of the present invention will now be described with reference to FIGS. 1 through 7.

FIRST EMBODIMENT (SEE FIGS. 1 AND 2)

The numeral 1 denotes a socket body formed of an insulating material. The socket body 1 includes a plurality of contacts 2 arranged in such a manner as to be able to contact with an electric part such as an IC, etc.

The numeral 3 denotes a contacting and releasing movable plate mounted on the surface of the socket body 1 and laterally movable along the surface. The movable plate 3 includes a plurality of through holes 4 adapted to permit terminals of an electric part placed on the movable plate to be inserted therein so as to contact with the corresponding contacts 2. The numeral 5 denotes a lateral movement operating lever for the movable plate 3. The lever 5 has a cam shaft 5a interposed between the closed ends of the movable plate 3 and the socket body 2, and an operating portion directly connected to an end portion of the cam shaft 5 and extending in parallel with the side surface of the socket body 1. Upon pivoting operation of the operating portion 5b either in its rising direction or in its lowering direction, the cam shaft 5a is pivoted. Depending on the pivoting direction of the cam shaft 5a, an eccentric shaft portion causes the movable plate 3 to be laterally moved in one direction or in the other direction, so that the terminals of the electric part and contacts 2 are brought into contact with each other or released from each other.

The above-described socket for an electric part is suitable used as a socket for a pin grid array type IC having a plurality of terminals projecting from a lower surface of a flat IC body.

The socket body 1 of such constructed socket for an electric part as described above is provided with a conductive pin 6. The conductive pin 6 includes a current-collecting portion 6a and a grounding portion directly connected to a lower end of the current-collecting portion 6a. The current-collecting portion 6a is embedded in the socket body 1 in such a manner as either to be press-fitted into a hole 7 opened at the surface of the socket body 1 or to be molded therein when the socket body 1 is molded. An upper end portion 6c (see FIG. 2) of the current-collecting portion 6a projects upwardly from the surface of the socket body 1 to form a current-collecting head portion 6c, and the current-collecting head portion is slide-fitted in an elongate hole 8 formed in the movable plate 3 and serving also as a guide for the movement of the movable plate 3. The grounding portion 6b of the conductive pin 6 projects downwardly of the socket body 1 so as to facilitate its easy contact with a circuit board, etc.

Owing to the foregoing arrangement, the current-collecting portion 6a is contacted with the surface of the socket body 1 by means of its intimate contact with the edge portion and the inner wall of the hole 7, and the current-collecting portion 6a is further contacted with the surface of the movable plate 3 by means of the intimate contact between the current-collecting portion 6c and the hole part of plate 3 defining 8 in order to collect electric charge on the surfaces of the socket body 1 and the movable plate 3.

The current-collecting pin 6 is preferably formed in a round pin shape, for example, the current-collecting portion 6a being formed as a round pin of a large diameter and the grounding portion 6b being formed as a round pin of a small diameter, and therefore, the current-collecting pin 6 is formed as a two-stage pin. The implanting depth of the current-collecting pin 6 is set at the stage portions of the current-collecting portion 6a and the grounding portion 6b, and a good contacting relation between the current-collecting portion 6a and the inner wall of the hole 7 is obtained. Preferably, by means of the setting of the implanting depth, the distal end face of the current-collecting head portion 6c is arranged to be a generally level with respect to the surface of the movable plate 3 to achieve a favorable contacting relation with the surface of the movable plate 3, so that the effect of current-collection is enhanced.

The conductive pin 6 is operated to guide the lateral movement of the movable plate 3 and also functions as the current-collecting means.

SECOND EMBODIMENT (SEE FIG. 3)

In this second embodiment, the conductive pin 6 described in the first embodiment is not provided with the current-collecting head portion 6c and is embedded in the hole 7 formed in the socket body 1, and the distal end face of the current-collecting portion is arranged to be generally level with respect to the surface of the socket body 1. All the remaining construction is the same as the first embodiment.

THIRD EMBODIMENT (SEE FIG. 4)

In this embodiment, the conductive pin 6 is embedded in the socket body 1 through the grounding portion 6b (or the current-collecting portion 6a), and the lower surface of the current-collecting portion 6a is arranged to rest on the surface of the socket body 1 in order to attain its contacting relation with the surface of the socket body 1. Further, it employs means for short-circuiting the current-collecting portion 6a to conductive shafts 11 and 12 adapted to pivotally support a pressing cover 9 or a lock lever 10. For example, the current-collecting portion 6a is provided with a groove 13 formed in an end face thereof, and the shafts 11 and 12 are fitted in the groove 13 to attain the contacting relation.

The socket body 1 is provided at one end thereof with the pressing cover 9 and at the other end with the lock lever 10. The arrangement is such that the pressing cover 9 is closed to press an electric part 16 and the lock lever 10 is engaged with the free end of the pressing cover 9 to maintain the closed state and the contacted state. In the above embodiment, by utilizing the conductive shafts 11 and 12 pivotably supporting the pressing cover 9 and the lock lever 10, these shafts 11 and 12 and the current-collecting portion 6a are short-circuited with respect to each other, thus enabling them to cooperate with each other to provide means for eliminating the static electricity.

The above embodiment can suitably be used for a leadless type IC socket.

FOURTH EMBODIMENT (SEE FIGS. 5 AND 6)

In this fourth embodiment, the current-collecting portion 6a is bifurcated, so that the shafts, etc. originally held by the socket are clamped by the forked parts of the current-collecting portion 6a. In this respect, this embodiment is common with the third embodiment.

More specifically, the cam shaft 5a of the lateral movement operating lever 5 of the movable plate 3 described in the first embodiment is clamp-contacted by the forked parts of the current-collecting portion 6a. That is, the socket body 1 has a groove 13 formed in the surface thereof and adapted to accommodate the cam shaft 5a therein. The conductive pin 6 is embedded in the socket body 1 such that the forked inner surfaces of the current-collecting portion 6a are exposed at the inner surface of the groove 13. The arrangement is such that when the cam shaft 5a is fitted in the groove 13, it is automatically fitted to and clamp-contacted by the forked parts of the current-collecting portion 6a. Further, the cam shaft 5a is contacted with the fork-shaped inner surfaces and pivoted to cause the movable plate 3 to move in the lateral direction.

FIFTH EMBODIMENT (SEE FIG. 7)

In this fifth embodiment, the socket for an electric part includes a contacting and releasing movable plate 3. As lateral movement operating means of the movable plate 3, one end of the lever 5 is pivotally supported by separate shafts 14 and 15 at one ends of the socket body 1 and movable plate 3. The arrangement is such that by pivotally rotating the lever 5 in the rising direction or in the lowering direction about the shaft 14, the shaft 15 is caused to pivot in order to move the movable plate 3 in the lateral direction.

On the other hand, the conductive pin 6 is bifurcated at the current-collecting portion 6a and implanted in the socket body 1, so that the shaft 14 is slide-fitted to an clamp-contacted with the forked inner surfaces of the current-collecting portion 6a, thus making it possible to collect the static electricity.

In the respect that the conductive pin 6 is short-circuited to the pivotable shaft, this embodiment is common with the third and fourth embodiments in which the conductive pin 6 is short-circuited to the shafts 11, 12 and 5a of the pressing cover 9 and the lock lever 10 or the lateral movement operating lever 5 of the movable plate 3.

Figure 8:
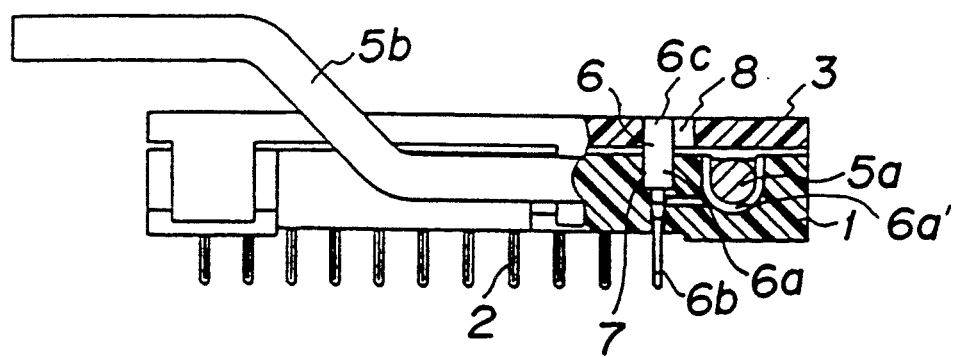
FIG. 8 is a view similar to FIG. 2 showing a still further embodiment of the present invention.

In FIG. 8 there is shown a combination of embodiments of FIGS. 1 and 2 and FIGS. 5 and 6, in which the shaft 5a is short circuited to conductive pin 6 by a portion 6a.

As described in the foregoing, according to the present invention, the electric charge on the surface of the socket for an electric part can be collected by the current-collecting portion which is conductively connected to the surface of the socket and such collected electric charge can rapidly be released by the grounding portion. Accordingly, the socket for an electric part according to the present invention can effectively be provided with a measure for eliminating static electricity which frequently exerts adverse effects on an electric part.

Further, by utilizing the shafts of the pressing cover, the lateral movement operating lever of the movable plate, etc. originally mounted on the socket and by further providing means for short-circuiting the current-collecting portion of the conductive pin thereto, they can cooperate with each other to significantly enhance the effect of elimination of the static electricity.

According to the present invention, the originally intended object can be achieved in a simple and inexpensive way in that the current-collecting pin is implanted in the socket body.

While specific embodiments of the invention have been shown and described in detail to illustrate the application of the principles of the invention, it will be understood that the invention may be embodied otherwise without departing from the spirit and scope of the invention.

What is claimed is:

1. A socket for an electric part, comprising:
a socket body formed of an insulating material and having a plurality of contacts thereof adapted to contact terminals of an electric part;
a contacting and releasing movable plate reciprocally slidable along a surface of said socket body for moving the terminals into and out of contact with said plurality of contacts, said movable plate further having an elongated guide groove therein elongated in the direction of movement of said plate;
a shaft and lever means of conductive material pivotally mounted on said socket body and connected to said movable plate for reciprocally moving said movable plate upon pivoting of said shaft by operation of said lever; and
a conductive pin in said socket body and having a current collecting portion for collecting an electric charge on a surface of said socket body and a grounding portion directly connected to said current collecting portion and projecting from said socket body, said current collecting portion extending into and being slidably engaged in said guide groove, and said current collecting portion further being short-circuited to said shaft and lever means.

2. A socket for an electric part, comprising:
a socket body formed of an insulating material and having a plurality of contacts thereof adapted to contact terminals of an electric part;
a contacting and releasing movable plate reciprocally slidable along a surface of said socket body for moving the terminals into and out of contact with said plurality of contacts, said movable plate further having an elongated guide groove therein elongated in the direction of movement of said plate;
a shaft and lever means pivotally mounted on said socket body and connected to said movable plate for reciprocally moving said movable plate upon pivoting of said shaft by operation of said lever; and
a rigid conductive pin in said socket body and having a current collecting portion for collecting an electric charge on a surface of said socket body and a grounding portion directly connected to said current collecting portion and projecting from said socket body, said current collecting portion extending into and being slidably engaged in said guide groove.

3. A socket for an electric part, comprising:
a socket body formed of an insulating material and having a plurality of contacts thereof adapted to contact terminals of an electric part;
a contacting and releasing movable plate reciprocally slidable along a surface of said socket body for moving the terminals into and out of contact with said plurality of contacts;
a shaft and lever means of conductive material pivotally mounted on said socket body and connected to said movable plate for reciprocally moving said movable plate upon pivoting of said shaft by operation of said lever; and
a conductive pin in said socket body and having a current collecting portion for collecting an electric charge on a surface of said socket body and a grounding portion directly connected to said current collecting portion and said current collecting portion being short-circuited to said shaft and lever means.

* * * * *